United States Patent
Embar et al.

(10) Patent No.: US 9,647,611 B1
(45) Date of Patent: May 9, 2017

(54) RECONFIGURABLE POWER SPLITTERS AND AMPLIFIERS, AND CORRESPONDING METHODS

(71) Applicant: FREESCALE SEMICONDUCTOR, INC., Austin, TX (US)

(72) Inventors: Ramanujam Srinidhi Embar, Gilbert, AZ (US); Joseph Staudinger, Gilbert, AZ (US); Margaret A. Szymanowski, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/925,718

(22) Filed: Oct. 28, 2015

(51) Int. Cl.
| | |
|---|---|
| *H03F 1/07* | (2006.01) |
| *H03F 1/02* | (2006.01) |
| *H03F 3/19* | (2006.01) |
| *H03F 3/21* | (2006.01) |
| *H01P 5/12* | (2006.01) |

(52) U.S. Cl.
CPC ............. *H03F 1/0288* (2013.01); *H01P 5/12* (2013.01); *H03F 3/19* (2013.01); *H03F 3/211* (2013.01); *H03F 2200/451* (2013.01); *H03F 2203/21106* (2013.01)

(58) Field of Classification Search
CPC ................................ H03F 1/07; H03F 1/0288
USPC ............................................. 330/295, 124 R
See application file for complete search history.

(56) References Cited

U.S. PATENT DOCUMENTS

| | | |
|---|---|---|
| 2,210,028 A | 8/1940 | Doherty |
| 3,613,028 A | 10/1971 | Seidel |
| 3,671,885 A | 6/1972 | Pennypacker |
| 3,982,244 A | 9/1976 | Ward et al. |
| 4,002,971 A | 1/1977 | Rast, Jr. et al. |
| 4,048,568 A | 9/1977 | Rast, Jr. et al. |

(Continued)

FOREIGN PATENT DOCUMENTS

| | | |
|---|---|---|
| EP | 0966097 A1 | 12/1999 |
| EP | 1076412 A2 | 2/2001 |

(Continued)

OTHER PUBLICATIONS

Fardin et al, "Electronically tunable lumped element 90 degree hybrid coupler", Electronics Letters, Mar. 2006, pp. 1-2, vol. 42, No. 6.

(Continued)

*Primary Examiner* — Henry Choe
(74) *Attorney, Agent, or Firm* — Sherry W. Schumm

(57) ABSTRACT

A reconfigurable Doherty power amplifier includes a packaged power splitter device, main and peaking amplifiers, and a combiner circuit. The power splitter device includes a power divider, input terminals coupled to first and second ports of the power divider, and output terminals coupled to third and fourth ports of the power divider. One of the input terminals is coupled to an RF signal input terminal, and the other input terminal is terminated. The power divider receives an input RF signal, and produces main and peaking RF signals at the third and fourth ports of the power divider, respectively. The main and peaking amplifiers amplify the main and peaking RF signals, respectively. The combiner circuit includes a summing node and a phase delay element between outputs of the main and peaking amplifiers. An RF signal output terminal is coupled to the summing node.

20 Claims, 5 Drawing Sheets

(56) References Cited

U.S. PATENT DOCUMENTS

| | | |
|---|---|---|
| 4,477,781 A | 10/1984 | Reuss, Jr. |
| 4,792,805 A | 12/1988 | Miglia |
| 4,975,604 A | 12/1990 | Barta |
| 4,987,378 A | 1/1991 | Eggleston et al. |
| 5,015,965 A | 5/1991 | Katz et al. |
| 5,148,062 A | 9/1992 | Goldfarb |
| 5,317,288 A | 5/1994 | Yung et al. |
| 5,349,364 A | 9/1994 | Bryanos et al. |
| 5,444,418 A | 8/1995 | Mitzlaff |
| 5,469,129 A | 11/1995 | Dydyk |
| 5,576,660 A | 11/1996 | Pouysegur et al. |
| 5,594,385 A | 1/1997 | Anvari |
| 5,884,143 A | 3/1999 | Wolkstein et al. |
| 5,929,804 A | 7/1999 | Jones et al. |
| 5,969,572 A | 10/1999 | Jeong et al. |
| 5,986,500 A | 11/1999 | Park et al. |
| 6,006,111 A | 12/1999 | Rowland |
| 6,041,077 A | 3/2000 | Clark et al. |
| 6,070,090 A | 5/2000 | Feuerstein |
| 6,111,462 A | 8/2000 | Mucenieks et al. |
| 6,112,062 A | 8/2000 | Hans et al. |
| 6,163,210 A | 12/2000 | Fukuchi |
| 6,208,204 B1 | 3/2001 | Suzuki et al. |
| 6,232,838 B1 | 5/2001 | Sugimoto |
| 6,236,286 B1 | 5/2001 | Hoffmann et al. |
| 6,255,908 B1 | 7/2001 | Ghannouchi et al. |
| 6,275,685 B1 | 8/2001 | Wessel et al. |
| 6,320,464 B1 | 11/2001 | Suzuki et al. |
| 6,356,149 B1 | 3/2002 | Stengel et al. |
| 6,515,544 B1 | 2/2003 | Suzuki et al. |
| 6,799,020 B1 | 9/2004 | Heidmann et al. |
| 6,972,621 B2 | 12/2005 | Matsuyoshi et al. |
| 7,071,775 B2 | 7/2006 | Gailus et al. |
| 7,078,976 B2 | 7/2006 | Blednov |
| 7,098,859 B2 | 8/2006 | Shimawaki et al. |
| 7,129,778 B2 | 10/2006 | Robinson |
| 7,167,693 B2 | 1/2007 | Bachman et al. |
| 7,205,817 B1 | 4/2007 | Huang et al. |
| 7,239,218 B2 | 7/2007 | Nakamura |
| 7,402,821 B2 | 7/2008 | Bernhardt |
| 7,427,895 B1 | 9/2008 | Okubo et al. |
| 7,518,448 B1 * | 4/2009 | Blair ............... H03F 1/0261 330/124 R |
| 7,525,395 B2 | 4/2009 | Hwang et al. |
| 7,598,805 B2 | 10/2009 | Staudinger et al. |
| 7,626,455 B2 | 12/2009 | Ito et al. |
| 7,663,435 B2 * | 2/2010 | Kim ............... H03F 1/0288 330/124 R |
| 7,680,467 B2 | 3/2010 | Ishigami |
| 7,683,828 B2 | 3/2010 | Stagliano et al. |
| 7,786,822 B2 | 8/2010 | Vice et al. |
| 7,813,766 B1 | 10/2010 | Lam |
| 7,928,817 B2 | 4/2011 | Atsumo |
| 8,035,444 B2 | 10/2011 | Okubo et al. |
| 8,195,118 B2 | 6/2012 | Warnick |
| 8,274,332 B2 * | 9/2012 | Cho et al. ............ H03F 1/0261 330/124 R |
| 8,354,882 B2 | 1/2013 | Blednov |
| 8,446,218 B2 * | 5/2013 | Gong ............... H03F 1/0288 330/124 R |
| 8,493,143 B2 | 7/2013 | Khilia et al. |
| 8,514,007 B1 | 8/2013 | Ahmed et al. |
| 8,576,010 B2 * | 11/2013 | Yanduru ............ H03F 1/0288 330/124 R |
| 8,606,206 B1 | 12/2013 | Lam et al. |
| 8,618,883 B2 * | 12/2013 | Cho ............... H03F 1/0261 330/124 R |
| 8,653,890 B1 | 2/2014 | Ahmed et al. |
| 8,674,746 B1 | 3/2014 | Staudinger |
| 8,710,924 B2 | 4/2014 | Van Der Zanden et al. |
| 8,712,466 B2 | 4/2014 | Martineau et al. |
| 8,736,347 B2 | 5/2014 | Ahmed et al. |
| 8,736,365 B2 | 5/2014 | Correa et al. |
| 8,760,261 B2 | 6/2014 | Panchalan et al. |
| 8,816,767 B2 * | 8/2014 | Ahmed ............... 330/107 |
| 8,957,734 B2 | 2/2015 | Ahmed et al. |
| 8,988,165 B2 | 3/2015 | Staudinger |
| 9,407,477 B2 | 8/2016 | Rozental et al. |
| 9,484,613 B1 | 11/2016 | Simons et al. |
| 2002/0041209 A1 | 4/2002 | Miyatani |
| 2003/0052734 A1 | 3/2003 | Ishigami et al. |
| 2005/0068102 A1 | 3/2005 | Hongo et al. |
| 2005/0195030 A1 | 9/2005 | Okazaki et al. |
| 2006/0044060 A1 | 3/2006 | Shiikuma |
| 2006/0091950 A1 | 5/2006 | Hayase |
| 2007/0164237 A1 | 7/2007 | Bernhardt |
| 2008/0012756 A1 | 1/2008 | Stagliano et al. |
| 2008/0039024 A1 | 2/2008 | Ikeda et al. |
| 2008/0111622 A1 | 5/2008 | Sperlich et al. |
| 2008/0238544 A1 | 10/2008 | Morris et al. |
| 2009/0167434 A1 | 7/2009 | Elmala |
| 2009/0206928 A1 | 8/2009 | Bowles et al. |
| 2010/0013527 A1 | 1/2010 | Warnick |
| 2010/0026387 A1 | 2/2010 | Blednov |
| 2010/0148860 A1 | 6/2010 | Rhodes et al. |
| 2010/0156528 A1 | 6/2010 | Couchman et al. |
| 2010/0227599 A1 | 9/2010 | Vella-Coleiro et al. |
| 2011/0304439 A1 | 12/2011 | Panchalan et al. |
| 2012/0224653 A1 | 9/2012 | Lozhkin |
| 2012/0294387 A1 | 11/2012 | Ghannouchi et al. |
| 2012/0299765 A1 | 11/2012 | Huang et al. |
| 2013/0120061 A1 | 5/2013 | Van Der Zanden et al. |
| 2013/0194017 A1 | 8/2013 | Staudinger |
| 2013/0194023 A1 | 8/2013 | Ahmed et al. |
| 2013/0241640 A1 | 9/2013 | Lin et al. |
| 2013/0314143 A1 | 11/2013 | Ahmed et al. |
| 2014/0077874 A1 | 3/2014 | Ahmed et al. |
| 2014/0125409 A1 | 5/2014 | Ahmed et al. |
| 2014/0253248 A1 | 9/2014 | Ahmed et al. |
| 2015/0054582 A1 | 2/2015 | Goss |
| 2015/0091653 A1 * | 4/2015 | Kobayashi ............ H03F 1/0288 330/295 |
| 2015/0116039 A1 | 4/2015 | Ahmed et al. |

FOREIGN PATENT DOCUMENTS

| | | |
|---|---|---|
| EP | 2017956 A1 | 1/2009 |
| EP | 2093879 A1 | 8/2009 |
| EP | 2521257 A1 | 11/2012 |
| EP | 2621085 A1 | 7/2013 |
| JP | 2003209447 A | 7/2003 |
| JP | 2005117599 A | 4/2005 |
| JP | 2010273212 A | 12/2010 |
| SU | 1737577 A1 | 5/1992 |
| WO | 9400890 A1 | 1/1994 |
| WO | 2011060058 A1 | 5/2011 |
| WO | 2013006943 A1 | 1/2013 |

OTHER PUBLICATIONS

Gysel, "A New N-way Power/Divider/Combiner Suitable for High-Power Applications", 1975 IEEE-MTT-S International Microwave Symposium, May 2015, pp. 116-118.

Chen, Jiashu et al., "Design and Analysis of a Stage-Scaled Distributed Power Amplifier," IEEE Transactions on Microwave Theory and Techniques, vol. 59, No. 5, pp. 1274-1283, May 2011.

Darraji, Ramzi et al., A Dual-Input Digitally Driven Doherty Amplifier Architecture for Performance Enhancement of Doherty Transmitters, IEEE Transactions on Microwave Theory and Techniques, vol. 59, No. 5, pp. 1284-1293, May 2011.

Hsu, Sen-Kuei et al., "A Novel Compact Forward-Wave Directional Coupler Design Using Periodical Patterned Ground Structure," IEEE Transactions on Microwave Theory and Techniques, vol. 59, No. 5, pp. 1249-1257, May 2011.

Lane, A.A. "GaAs MMIC Phase Shifters for Pahse Arrays;IEEE Colloquim on Solid State Components for Radar"; pp. 3/1-3/5; 1988.

Mortazy, Ebrahim et al., "Mode Coupling Between Substrate Integrated Waveguide and Coplanar Waveguide for Traveling-Wave Electrooptical Modulator," IEEE Transactions on Microwave Theory and Techniques, vol. 59, No. 5, pp. 1258-1264, May 2011.

(56) References Cited

OTHER PUBLICATIONS

Sazegar, Mohsen et al., "Low-Cost Phased-Array Antenna Using Compact Tunable Phase Shifters Based on Ferroelectric Ceramics," IEEE Transactions on Microwave Theory and Techniques, vol. 59, No. 5, pp. 1265-1273, May 2011.
Zawrotny, K. et al., "C-Band 4-Bit Phase Shifter MMIC"; Microwaves, Radar and Wireless Communications 2008; Mikon 2008 17th international conference; 4 pages.
Notice of Allowance mailed Oct. 29, 2013 for U.S. Appl. No. 13/653,155, 9 pages.
Notice of Allowance mailed Oct. 9, 2013 for U.S. Appl. No. 13/656,551, 10 pages.
Notice of Allowance mailed Apr. 16, 2014 for U.S. Appl. No. 14/152,081, 8 pages.
Notice of Allowance mailed Oct. 3, 2014 for U.S. Appl. No. 14/464,270, 8 pages.
Non-Final Office Action mailed Mar. 24, 2015 for U.S. Appl. No. 14/066,601, 7 pages.
U.S. Appl. No. 14/066,601, filed Oct. 29, 2013, entitled "Adaptive Adjustment of Power Splitter".
Partial European Search Report mailed Mar. 15, 2015 for EP 141897014, 8 pages.
Extended European Search Report mailed Sep. 14, 2015 for EP 141897014, 13 pages.
Final Rejection mailed Jul. 9, 2015 for U.S. Appl. No. 14/066,601, 4 pages.
Notice of Allowance mailed Sep. 28, 2015 for U.S. Appl. No. 14/066,601, 8 pages.
Non-Final Office Action mailed Dec. 23, 2013 for U.S. Appl. No. 13/360,119, 8 pages.
Notice of Allowance mailed Nov. 20, 2014 for U.S. Appl. No. 13/360,119, 7 pages.
Non-Final Rejection mailed Feb. 7, 2013 for U.S. Appl. No. 13/360,473, 7 pages.
Notice of Allowance mailed May 16, 2013 for U.S. Appl. No. 13/360,473, 9 pages.
Non-Final Rejection mailed Sep. 10, 2013 for U.S. Appl. No. 13/959,254, 10 pages.
Notice of Allowance mailed Jan. 7, 2014 for U.S. Appl. No. 13/959,254, 7 pages.
Non-Final Rejection mailed Oct. 9, 2014 for U.S. Appl. No. 14/287,139, 12 pages.
Notice of Allowance mailed Mar. 18, 2015 for U.S. Appl. No. 14/287,139, 8 pages.
Notice of Allowance mailed Apr. 28, 2015 for U.S. Appl. No. 14/287,139, 10 pages.
EP Application 13151802.9 Partial Search Report, dated Sep. 26, 2014, pp. 1-8.
EP Application 13151802.9 Search Report, dated Jan. 13, 2015, 13 pages.
Final Rejection mailed Oct. 15, 2014 for U.S. Appl. No. 14/086,520, 5 pages.
Non-Final Rejection mailed Jul. 1, 2014 for U.S. Appl. No. 14/086,520, 9 pages.
Non-Final Rejection mailed May 20, 2015 for U.S. Appl. No. 14/086,520, 7 pages.
Notice of Allowance mailed Sep. 16, 2015 for U.S. Appl. No. 14/086,520, 5 pages.
Notice of Allowance mailed Apr. 2, 2015 for U.S. Appl. No. 14/086,520, 9 pages.
Notice of Allowance mailed Sep. 30, 2016 for U.S. Appl. No. 14/500,992, 7 pages.
Non-Final Rejection mailed Feb. 3, 2017 for U.S. Appl. No. 14/500,992, 8 pages.

* cited by examiner

US 9,647,611 B1

RECONFIGURABLE POWER SPLITTERS AND AMPLIFIERS, AND CORRESPONDING METHODS

TECHNICAL FIELD

This invention relates to power amplifiers in general and more specifically to techniques and apparatus for reconfiguring power amplifiers.

BACKGROUND

With the advent of new telecommunication systems that require higher power, higher operational frequencies, and/or wider bandwidths, it is increasingly difficult to provide power amplifiers that exhibit desired efficiency and linearity characteristics. This may be particularly true for the amplifiers driving base stations in communications networks.

One specific type of power amplifier used in wireless communication systems is a Doherty power amplifier. Doherty power amplifiers are suitable for use in such applications because the amplifiers include separate amplification paths (e.g., a main path and a peaking path). The two paths are configured to operate in different modes. More particularly, the main amplification path typically operates in a class AB mode in which it provides gain at any power level, and the peaking amplification path typically operates in a class C mode in which it only conducts during half of the cycle. This can enable improved power-added efficiency of the amplifier, as compared to a balanced amplifier, at the power levels commonly encountered in wireless communications applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
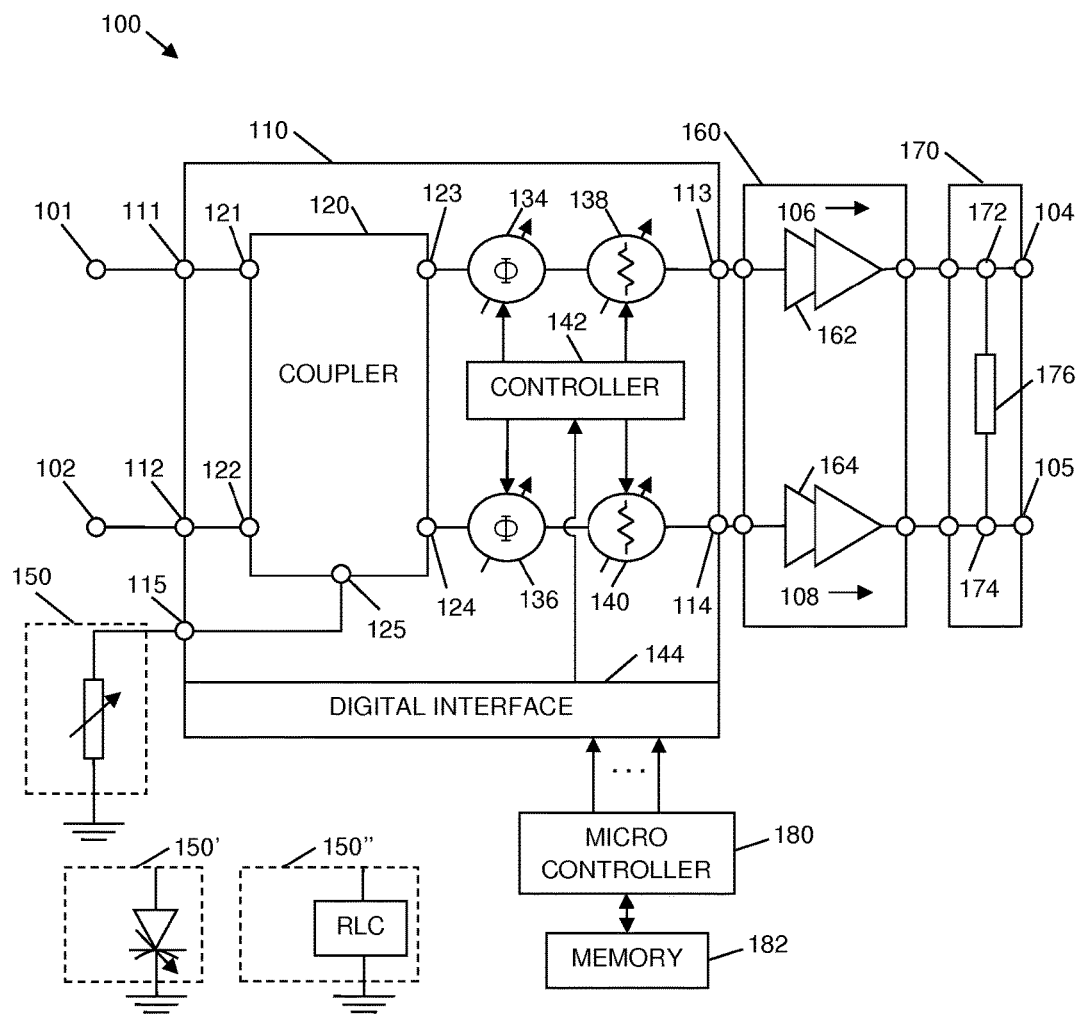
FIG. 1 illustrates, in block diagram form, a reconfigurable power splitter incorporated in an amplifier system that may be configured as a conventional Doherty power amplifier or as an inverted Doherty power amplifier, in accordance with an example embodiment.

In a conventional Doherty power amplifier, a power splitter divides the power of an input RF signal into two signals (referred to below as a "main RF signal" and a "peaking RF signal"), provides the main RF signal to a main amplification path, and provides the peaking RF signal to a peaking amplification path. In the process of dividing the signals, the power splitter imparts a 90 degree phase delay to the peaking RF signal. After amplification of the two RF signals by the main and peaking power amplifiers, and to compensate for the phase delay applied by the splitter to the peaking RF signal, a 90 degree phase delay is applied to the amplified main RF signal. Thereafter, the amplified main and peaking RF signals are reactively combined in phase at a summing node.

In some systems, it may be desirable to utilize an "inverted" Doherty power amplifier, rather than a conventional Doherty power amplifier. In an inverted Doherty power amplifier, the power splitter imparts a 90 degree phase delay to the main RF signal, rather than to the peaking RF signal. On the output side of the amplifier, to compensate for the phase delay applied to the main RF signal by the splitter, a 90 degree phase delay is applied to the amplified peaking RF signal, rather than to the amplified main RF signal. Once again, the amplified main and peaking RF signals are reactively combined in phase at a summing node.

A physical realization of a Doherty (or inverted Doherty) power amplifier (e.g., the implementation of FIG. 7) typically includes a printed circuit board (PCB) to which the various components of the amplifier are coupled. For example, the splitter may be implemented as a multi-port power divider that is connected to the PCB. Generally, the splitter implements a fixed power split ratio (i.e., the percentage of RF signal power provided to each amplifier path is fixed). A first conductive path on the PCB may be used to convey an input RF signal from an input connector to a first one of the divider ports. Second and third divider ports produce the main RF signal and the peaking RF signal, respectively. Second and third conductive paths on the PCB may be used to convey these signals to the main and peaking power amplifiers. Note that, as used herein, the terms "splitter" and "divider" are used to distinguish a packaged microwave device (referred to herein as a "splitter") that is used to distribute the power of an input RF signal and also may include other functionality (e.g., applying variable phase shifts and/or attenuation to the signals) from a component within the packaged microwave device (referred to herein as a "divider") which performs the actual power division. The use of the terms "splitter" and "divider" herein are not meant to limit either type of device or component to any particular number of ports, any particular circuit topology, or to being either directional or non-directional.

The main and peaking power amplifiers may be implemented as one or more packaged power transistor devices that are connected to the PCB. Each of the amplifiers includes an input lead and an output lead. The input leads are connected to the second and third conductive paths between the splitter and the power amplifiers. On the output side of the power transistors, the output lead for either the main or peaking amplifier may be connected through a fourth conductive path to a summing node, where the fourth conductive path may include a quarter wave transmission line. The quarter wave transmission line is used to provide the 90 degree phase delay either to the main RF signal or to the peaking RF signal, depending on whether the Doherty power amplifier is configured as a conventional Doherty power amplifier or as an inverted Doherty power amplifier, respectively. The output lead for the other amplifier may be directly connected to the summing node through a fifth conductive path. Finally, a sixth conductive path on the PCB may be used to convey the combined RF signal from the summing node to an output connector.

As the above description indicates, a particular PCB board and component design will be specific either to a conventional Doherty power amplifier or to an inverted Doherty power amplifier. However, it may be desirable to have a PCB and component combination that enables a single PCB design to be usable for both conventional Doherty and inverted Doherty amplifier configurations with minor modifications to the various conductive paths and features of the PCB. It may be particularly desirable for such a PCB and component combination to yield an amplifier that is very compact, and that does not add additional insertion losses or other undesirable performance degradations to the amplifier system. Further, it may be desirable to utilize an embodiment of a reconfigurable power splitter that may be used in either conventional Doherty or inverted Doherty amplifiers, and which enables the split ratio for the main and peaking RF signals to be adjustable. Further still, it may be desirable to utilize an embodiment of a reconfigurable power splitter that enables a variable phase delay and/or a variable attenuation to be applied to either or both the main and peaking RF signals. As will be described in detail below, various embodiments of reconfigurable power splitters and reconfigurable amplifiers have some or all of these desirable features.

FIG. 1 illustrates, in block diagram form, a reconfigurable power splitter 110 incorporated in an amplifier system 100 that may be configured as a conventional Doherty power amplifier or as an inverted Doherty power amplifier, in accordance with an embodiment. Amplifier system 100 includes two input terminals 101, 102, two output terminals 104, 105, a reconfigurable power splitter 110, an amplifier circuit 160, and a power combiner circuit 170, according to an embodiment. The reconfigurable power splitter 110 has multiple input terminals 111, 112 and multiple output terminals 113, 114, and is coupled between input terminals 101, 102 and input terminals (not labeled) to the amplifier circuit 160. The combiner circuit 170 is coupled between output terminals (not labeled) of the amplifier circuit 160 and output terminals 104, 105 of the amplifier system 100. An input signal received at either of input terminals 101 or 102 (e.g., a radio frequency (RF) signal) is amplified by amplifier system 100 and provided to a load (e.g., an antenna, not illustrated) via one of the output terminals 104, 105.

Amplifier system 100 is configured in a reconfigurable Doherty power amplifier topology, which includes multiple amplifiers 162, 164 along parallel amplification paths 106, 108, each or both of which may supply current to a load (e.g., an antenna, not illustrated). More specifically, amplifier system 100 is a two-way Doherty power amplifier, which includes a main amplifier 162 (biased in a class-AB mode during operation) along a main amplification path 106, and a peaking amplifier 164 (biased in a class-C mode during operation) along a peaking amplification path 108. As will be described in more detail in conjunction with FIGS. 2 and 3, the amplifier system 100 may be configured as a conventional Doherty power amplifier (FIG. 2) or as an inverted Doherty power amplifier (FIG. 3). Either way, at input power levels below the threshold of the peaking amplifier 164, only the main amplifier 162 provides current to a load through one of the output terminals 104, 105. At input power levels exceeding the threshold of the peaking amplifier 164, signals output from both the main and peaking amplifiers 162, 164 are summed in-phase by combiner circuit 170 to provide current to the load through one of the output terminals 104, 105.

In other embodiments, amplifier system 100 may include a main amplifier and two or more peaking amplifiers, with each peaking amplifier being biased at a different class-C operating point. Accordingly, although amplifier system 100 includes only two amplification paths 106, 108, an amplifier system may include three (or more) amplification paths, in alternate embodiments. In addition, although embodiments of Doherty power amplifier topologies are discussed in detail herein, those of skill in the art would understand, based on the description herein, that the embodiments may be implemented in amplifiers having topologies other than Doherty power amplifier topologies. In addition, embodiments may be implemented in amplifiers having more than two amplification paths.

Reconfigurable power splitter 110 is configured to divide the power of the input RF signal (received at terminal 101 or 102) into main and peaking RF signals for provision to the main and peaking amplification paths 106, 108, respectively. Reconfigurable power splitter 110 includes a plurality of terminals 111-115, a power divider 120, multiple RF signal adjustment circuits (including elements 134, 136, 138, 140), a controller circuit 142, and a digital interface 144, in an embodiment. As will be described in more detail in conjunction with FIG. 6 later, the various components of reconfigurable power splitter 110 may be packaged together in a single device package (e.g., an air cavity package or an overmolded package), although some of the components may be separately packaged, in other embodiments.

Divider 120 is a multi-port divider. According to an embodiment, the divider 120 includes at least five ports 121-125, each of which is coupled to a corresponding terminal 111-115 of the reconfigurable power splitter 110. In an alternate embodiment, the divider 120 may exclude port 125, and the reconfigurable power splitter 110 may exclude terminal 115. As will be described in more detail in conjunction with FIGS. 2-5, the divider 120 is configured to split the power of an input RF signal received at port 121 or 122 (through terminals 101/111 or 102/112) into two signals, and to provide the split RF signals to the two amplification paths 106, 108 through ports 123, 124. Essentially, the input RF signal is provided either to port 121 or to port 122, and the other port is terminated (e.g., with a 50 ohm termination).

The divider 120 may be configured to divide the input RF signal power equally between the amplification paths 106, 108, such that roughly 50 percent of the input RF signal power is provided to each amplification path 106, 108 (i.e., the divider 120 functions as a 3 dB splitter, which implements a 50:50 power split ratio). Alternatively, the divider 120 may be configured to divide the input RF signal power unequally between the amplification paths 106, 108 (i.e., the divider 120 functions as a 4 dB, 5 dB, or other splitter, which implements a power split ratio other than a 50:50 split ratio).

As will be explained in more detail in conjunction with FIGS. 4 and 5, later, the split ratio may be set, in an embodiment, using a split ratio defining circuit 150, 150', or 150", which is coupled to port 125 of the divider 120 through terminal 115 of the reconfigurable divider 120. Essentially, the split ratio defining circuit 150, 150', or 150" includes a passive or active load, which may or may not be a variable load. In embodiments in which the split ratio defining circuit is variable, it may be controlled with an analog or a digital signal, in various embodiments. For example, split ratio defining circuit 150 may be a variable capacitor with a capacitance value that is voltage controlled, in an embodiment. Alternatively, another embodiment of the split ratio defining circuit 150' may include a varactor diode, which essentially provides a variable capacitance that is voltage controlled. Yet another embodiment of the split ratio defining circuit 150" may include an RLC (resistance, inductance, capacitance) circuit, which may include any combination of fixed-value resistors, inductors, and/or capacitors. Other types of split ratio defining circuits may be used, in still other embodiments. Alternatively, port 125 or terminal 115 may be shorted to ground, which may cause the divider 120 to apply an equal (i.e., 50:50) split ratio for the main and peaking RF signals. Further, although the split ratio defining circuit 150, 150', or 150" is shown to be external to the divider 120 and the reconfigurable power splitter 110, the split ratio defining circuit 150, 150', or 150" may be internal to the divider 120 or to the reconfigurable power splitter 110, in other embodiments. As indicated previously, in still other embodiments, the split ratio defining circuit 150, 150', or 150" may be excluded altogether.

According to an embodiment, and as will be described in more detail in conjunction with FIGS. 4 and 5, the divider 120 also may apply phase delays to either or both signals produced by the divider 120 to achieve a phase difference (typically a value of about 90 degrees) between the signals carried along the amplification paths 106, 108. In other words, divider 120 adjusts the phase(s) of either or both signals so that the signals carried along the two amplification paths 106, 108 are out of phase (e.g., about 90 degrees out of phase) with respect to each other.

According to an embodiment, "RF signal adjustment circuits" are coupled between the outputs of the divider 120 (or ports 123, 124) and the inputs to the amplifiers 162, 164 (or terminals 113, 114). For example, a first RF signal adjustment circuit may include a first adjustable phase shifter 134 and a first adjustable attenuator 138 coupled between port 123 and terminal 113 along the main amplification path 106, and a second RF signal adjustment circuit may include a second adjustable phase shifter 136 and a second adjustable attenuator 140 coupled between port 124 and terminal 114 along the peaking amplification path 108. The adjustable phase shifters 134, 136 and adjustable attenuators 138, 140 enable adjustments to be made in the phase and amplitude (or attenuation) of the RF signals carried along amplification paths 106, 108, in order to provide optimal balancing between the RF signals provided to amplifiers 162, 164.

According to an embodiment, each phase shifter 134, 136 may be digitally controlled to apply one of a plurality of discrete phase shifts to the signals carried along paths 106, 108, respectively. Similarly, each attenuator 138, 140 may be digitally controlled to apply one of a plurality of discrete attenuation levels to the signals carried along paths 106, 108, respectively. More specifically, based on control signals provided by controller circuit 142, the first and second adjustable phase shifters 134, 136 apply phase shifts to the signals conveyed along the main and peaking amplification paths 106, 108. Similarly, based on control signals provided by controller circuit 142, the first and second adjustable attenuators 138, 140 attenuate the signals conveyed along the main and peaking amplification paths 106, 108. For example, the first and second adjustable phase shifters 134, 136 may include a configuration of switches (e.g., transistors) that may be controlled to achieve a desired signal phase shift, and the controller circuit 142 may produce switch control signals that affect the states of the switches. Similarly, the first and second adjustable attenuators 138, 140 may include a configuration of switches (e.g., transistors) that may be controlled to achieve a desired attenuation level, and the controller circuit 142 may produce switch control signals that affect the states of the switches.

For example, each phase shifter 134, 136 may be configured to apply one of eight phase shifts, with a step size of about 7.0 degrees between each selectable phase shift value (e.g., the range of phase shifts may be between about 0 degrees and about 49 degrees, with about 7.0 degrees between each selectable phase shift value). As a further example, each attenuator 138, 140 may be configured to apply one of 16 discrete attenuation levels, with a step size of about 0.5 decibels (dB) between each selectable attenuation level (i.e., the range of attenuation levels may be between about 0 dB and about 7.5 dB, with about 0.5 dB between each selectable attenuation level). In alternate embodiments, a system may support more or fewer selectable phase shift values, more or fewer selectable attenuation levels, different step sizes between phase shifts and/or attenuations, and/or different numbers of bits to convey the selectable phase shifts and/or attenuations.

Controller circuit 142 receives, from digital interface 144, signals indicating the phase shifts and attenuations that controller circuit 142 should cause the adjustable phase shifters 134, 136 and adjustable attenuators 138, 140 to apply along amplification paths 106 and 108. For example, a microcontroller 180 or other circuitry (e.g., switches/fuses or other circuitry) may provide a digital signal (e.g., binary or otherwise) indicating the phase shift and attenuation values to the digital interface 144, which in turn may convey the digital signal to controller circuit 142. In the above described embodiment, for example, three bits may be used to convey any of the eight selectable phase shift values, and four bits may be used to convey any of the 16 selectable attenuation levels.

Microcontroller 180 may determine which phase shift and attenuation values to specify based on one or more of a variety of operational conditions and/or other criteria. For example, microcontroller 180 may determine which phase shift and attenuation values to indicate based on an evaluation of one or more current operational conditions that are selected from a temperature, a power of the input RF signal (e.g., at input 101 or 102), a power of the output RF signal (e.g., at output 104 or 105), a signal frequency (e.g., the fundamental or center frequency of the input RF signal), bias voltages applied to the amplifiers 162, 164 (e.g., Vdd and/or Vgs), or other conditions. According to an embodiment, a calibration table may be stored in memory 182, which enables microcontroller 180 to determine which phase shift and attenuation values to specify based on the current operational conditions.

The digital interface 144 may include, for example a serial interface (e.g., a serial peripheral interface (SPI)) and/or a parallel interface. For example, the digital interface 144 may include one or more inputs for receiving phase shift and attenuation values from microcontroller 180 or other circuitry for provision to controller circuit 142. In addition to the above-described inputs, reconfigurable power splitter 110 may include additional interfaces for receiving clock signals, reset signals, power, ground, and so on.

Although the adjustable phase shifters 134, 136 are shown to precede the adjustable attenuators 138, 140 along amplification paths 106, 108, the phase shifters 134, 136 and attenuators 138, 140 may be reversed in order, in an alternate embodiment. Further, some embodiments may include only adjustable phase shifters (e.g., phase shifters 134, 136) or only adjustable attenuators (e.g., attenuators 138, 140), but not both. In still other embodiments, only one of the amplification paths 106, 108 may include an adjustable attenuator and/or an adjustable phase shifter. In still other embodiments, one of the amplification paths may include only an adjustable attenuator (and no adjustable phase shifter), and the other amplification path may include only an adjustable phase shifter (and no adjustable attenuator). Further still, some embodiments may have the RF signal adjustment circuits coupled between the outputs of the amplifiers 162, 164 and the inputs to the combiner circuit 170, instead of or in addition to being coupled to the inputs of the amplifiers 162, 164.

Within amplifier circuit 160, amplifiers 162, 164 each are configured to amplify the RF signals provided at terminals 113 and 114, respectively, by the reconfigurable power splitter 110. According to various embodiments, amplifiers 162, 164 may be packaged in separate packages, or may be packaged together in a single device package, which may be an air cavity or overmolded package. In addition, each of amplifiers 162, 164 may be a single stage amplifier, or may be a multiple-stage amplifier. The amplifier circuit 160 also may include input and/or output impedance matching circuits coupled to each of the amplifiers 162, 164, in an embodiment. Either or both the input and/or output impedance matching circuits may be included within the same device package(s) as amplifiers 162, 164. Alternatively, either or both the input and/or output impedance matching circuits may be external to the device package(s) within which amplifiers 162, 164 are included.

After amplification of the RF signals carried on the main and peaking amplification paths 106, 108 by the amplifiers 162, 164, the amplified RF signals are combined by combiner circuit 170. When the amplifier system 100 is configured as a conventional Doherty power amplifier, the combiner circuit 170 applies a phase shift (typically a value of 90 degrees) using a phase delay element 176 (e.g., a quarter wave length transmission line) to the signal carried along amplification path 106, so that the signals carried along the two amplification paths 106, 108 may be summed in phase at summing node 174 before being provided to output terminal 105. Conversely, when the amplifier system 100 is configured as an inverted Doherty power amplifier, the combiner circuit 170 applies a phase shift using the phase delay element 176 to the signal carried along amplification path 108, so that the signals carried along the two amplification paths 106, 108 may be summed in phase at summing node 172 before being provided to output terminal 104.

As indicated above, the Doherty power amplifier 100 of FIG. 1 readily may be configured in either a conventional Doherty power amplifier configuration or an inverted Doherty power amplifier configuration. More particularly, and in contrast with prior Doherty power amplifiers, embodiments of Doherty power amplifiers include two (rather than one) input terminals (e.g., terminals 101 and 102), and also include two (rather than one) output terminals (e.g., terminals 104 and 150). Depending on whether the Doherty power amplifier 100 is to be configured in a conventional or inverted configuration, an input RF signal is provided to one or the other of the multiple input terminals (e.g., either terminal 101 or 102), and the amplified output RF signal is produced by one or the other of the multiple output terminals (e.g., either terminal 104 or 105).

In addition, and in contrast with prior Doherty power amplifiers, embodiments of Doherty power amplifiers include a power splitter (e.g., reconfigurable power splitter 110), which may receive an input RF signal from either of two input terminals (e.g., terminals 111, 112). Further, depending on which input terminal the RF signal is provided on, embodiments of a power splitter may apply a phase delay (e.g., a 90 degree phase delay) to a divided RF signal on either of two amplification paths (e.g., amplification path 106 or 108). Further, depending on which amplification path the phase delay is applied to, the inclusion of two output terminals (e.g., terminals 104, 105) enables a compensatory phase delay (e.g., from delay element 176) to be applied to the other amplification path, so that the signals carried on the amplification paths may be summed in phase at one of two summing nodes (e.g., summing node 172 or 174). Finally, depending on which of the two summing nodes produces the in-phase combination of the RF signals, the amplified output RF signal may be provided to a load through one of the two output terminals (e.g., terminal 104 or 105) that is coupled to that summing node.

As will be explained in more detail in conjunction with FIGS. 2 and 3, configuration of the Doherty power amplifier 100 as a conventional Doherty power amplifier may be achieved merely by providing the input RF signal to terminal 101, terminating terminal 102, and accessing the amplified output RF signal at terminal 105. Conversely, configuration of the Doherty power amplifier 100 as an inverted Doherty power amplifier may be achieved merely by providing the input RF signal to terminal 102, terminating terminal 101, and accessing the amplified output RF signal at terminal 104. As will be explained in more detail later, either configuration may be readily achieved with minor modifications to a PCB upon which the components of the Doherty power amplifier are coupled.

Further, and as indicated above, the power splitter 110 and/or divider 120 may be configured to enable the split ratio between the main and peaking RF signals to be adjusted (e.g., with the inclusion of split ratio defining circuit 150, 150', 150"), in various embodiments. Further still, the power splitter 110 may be configured to enable a variable phase delay and/or a variable attenuation to be applied to either or both the main and peaking RF signals.

Figure 2:
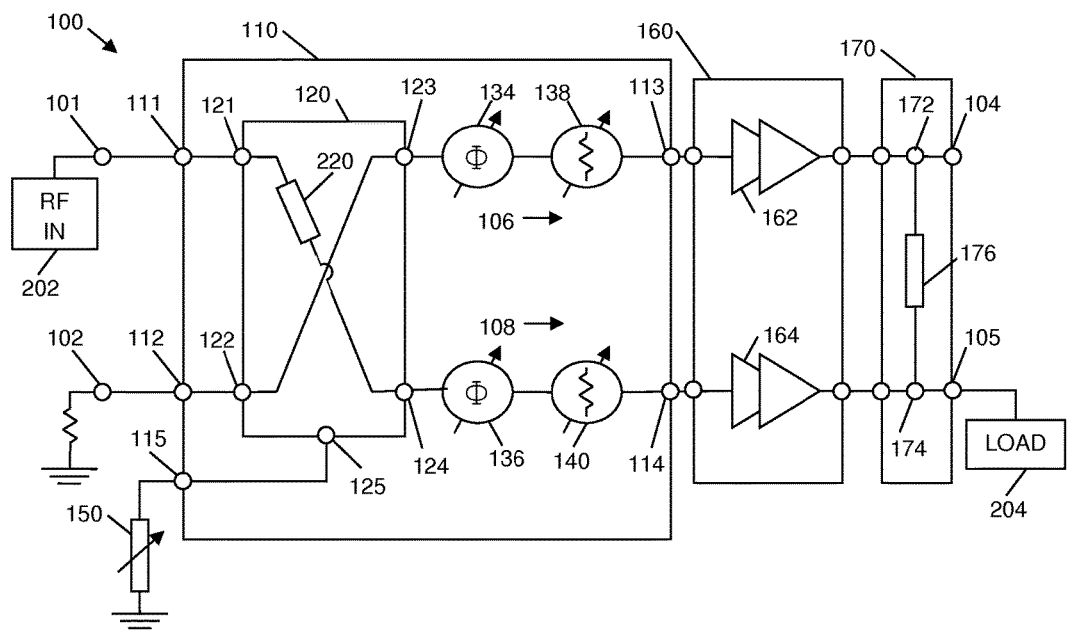
FIG. 2 illustrates the Doherty power amplifier of FIG. 1 in a conventional Doherty power amplifier configuration, in accordance with an example embodiment.
Figure 3:
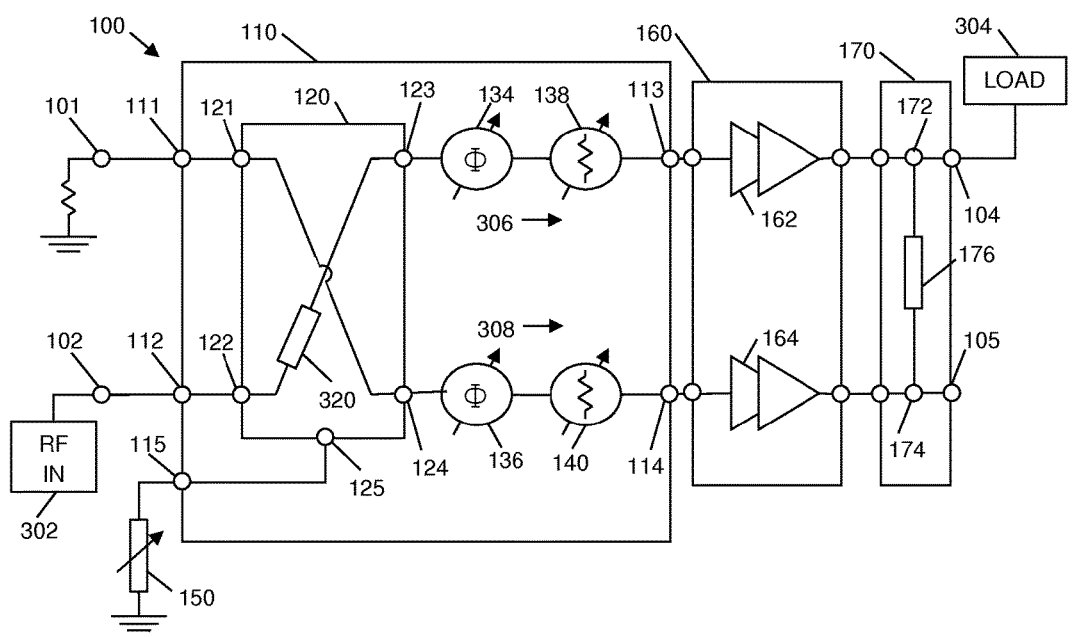
FIG. 3 illustrates the Doherty power amplifier of FIG. 1 in an inverted Doherty power amplifier configuration, in accordance with an example embodiment.

FIG. 2 illustrates the Doherty power amplifier 100 of FIG. 1 in a conventional Doherty power amplifier configuration, in accordance with an example embodiment. To configure Doherty power amplifier 100 in the conventional configuration, input terminal 101 is coupled to an RF signal source 202 (RF IN), and input terminal 102 may be terminated (e.g., with a 50 ohm termination). On the output side, output terminal 105 is coupled to a load 204 (e.g., an antenna), and output terminal 104 may be left floating.

In this configuration, divider 120 receives the input RF signal at port 121, and splits the input RF signal into a main RF signal and a peaking RF signal. The split ratio may be 50:50 (i.e., the divider 120 may be a 3 decibel (dB) divider), or the split ratio defining circuit 150 (or 150' or 150") may be used to adjust the split ratio to a ratio other than 50:50. Either way, the divider 120 provides the main RF signal to the main amplification path 106 through port 123, and provides the peaking RF signal to the peaking amplification path 108 through port 124. According to an embodiment, the divider 120 is configured to apply a phase delay (e.g., about 90 degrees), which is represented by element 220, to the peaking RF signal, so that the peaking RF signal is delayed, with respect to the main RF signal, by the phase delay.

As described above, the phase and/or amplitude of the main and/or peaking RF signals may be adjusted by the variable phase shifters 134, 136 and/or the variable attenuators 138, 140, before the main and peaking RF signals are produced at terminals 113, 114 of the reconfigurable power splitter 110. The main and peaking amplifiers 162, 164 then amplify the main and peaking RF signals, respectively, and the amplified main and peaking RF signals are provided to combiner 170. In the conventional configuration illustrated in FIG. 2, phase delay element 176 applies a phase delay (e.g., about 90 degrees) to the amplified main RF signal, and the delayed and amplified main RF signal is combined in phase with the amplified peaking RF signal at summing node 174. The resultant signal is then provided to the load 204 through output terminal 105.

FIG. 3 illustrates the Doherty power amplifier of FIG. 1 in an inverted Doherty power amplifier configuration, in accordance with an example embodiment. To configure Doherty power amplifier 100 in the inverted configuration, input terminal 102 is coupled to an RF signal source 302 (RF IN), and input terminal 101 may be terminated (e.g., with a 50 ohm termination). On the output side, output terminal 104 is coupled to a load 304 (e.g., an antenna), and output terminal 105 may be left floating.

In this configuration, divider 120 receives the input RF signal at port 122, and splits the input RF signal into a main RF signal and a peaking RF signal. Once again, the split ratio may be 50:50, or the split ratio defining circuit 150 (or 150' or 150") may be used to adjust the split ratio to a ratio other than 50:50. Either way, the divider 120 provides the main RF signal to the main amplification path 106 through port 123, and provides the peaking RF signal to the peaking amplification path 108 through port 124. According to an embodiment, the divider 120 is configured to apply a phase delay (e.g., about 90 degrees), which is represented by element 320, to the main RF signal, so that the main RF signal is delayed, with respect to the peaking RF signal, by the phase delay.

Once again, the phase and/or amplitude of the main and/or peaking RF signals may be adjusted by the variable phase shifters 134, 136 and/or the variable attenuators 138, 140, before the main and peaking RF signals are produced at terminals 113, 114 of the reconfigurable power splitter 110. The main and peaking amplifiers 162, 164 then amplify the main and peaking RF signals, respectively, and the amplified main and peaking RF signals are provided to combiner 170. In the inverted configuration illustrated in FIG. 3, phase delay element 176 applies a phase delay (e.g., about 90 degrees) to the amplified peaking RF signal, and the delayed and amplified peaking RF signal is combined in phase with the amplified main RF signal at summing node 172. The resultant signal is then provided to the load 304 through output terminal 104.

As will be explained in more detail in conjunction with FIGS. 4 and 5, various different types of power dividers (e.g., divider 120) may be implemented in a power splitter (e.g., reconfigurable power splitter 110, FIG. 1) of a reconfigurable amplifier system (e.g., amplifier system 100), including both reconfigurable power dividers and non-reconfigurable (i.e., fixed) power dividers. For example, a power divider (e.g., divider 120) may include a branchline coupler (e.g., FIG. 4), a quadrature coupler (e.g., FIG. 5), a Lange coupler, a rat-race coupler, a Gysel power splitter, or another type of suitable power divider, in various embodiments. Although embodiments of power dividers typically may include microstrip line-types of power dividers (e.g., which may be more compact at higher frequencies), a power divider alternatively may use discrete components or integrated passive devices, in other embodiments. Further, although FIGS. 4 and 5 illustrate couplers that include only a single coupler section, other embodiments may include cascaded couplers (e.g., with multiple cascaded coupler sections), which may provide wider bandwidth.

Figure 4:
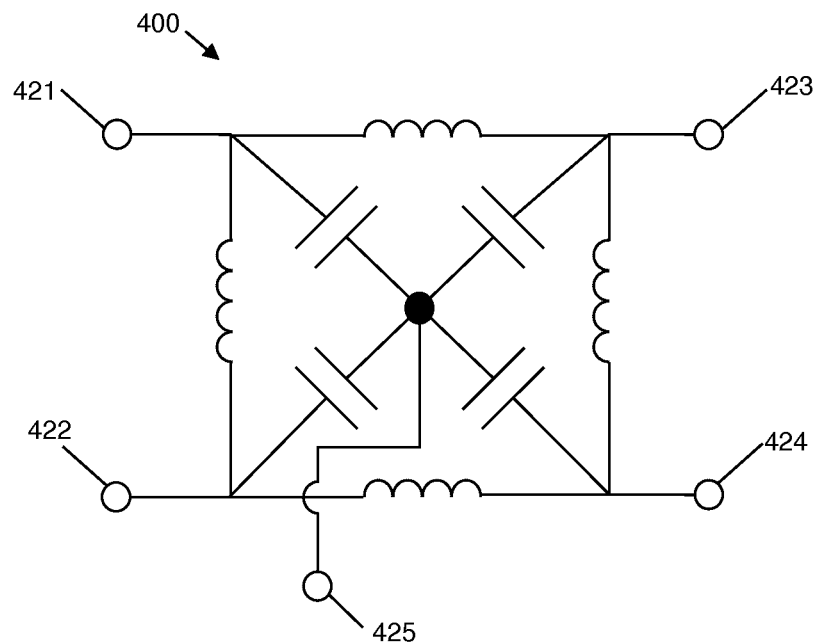
FIG. 4 illustrates a branchline coupler, in accordance with an example embodiment.

FIG. 4 illustrates a branchline coupler 400 that may be included in a power divider (e.g., power divider 120, FIG. 1), in accordance with an example embodiment. Branchline coupler 400 includes five ports 421, 422, 423, 424, 425, in the illustrated embodiment, which correspond to ports 121-125 of FIG. 1. Essentially, branchline coupler 400 includes inductances extending between ports 421 and 423, ports 421 and 422, ports 422 and 424, and ports 423 and 424. In addition, branchline coupler 400 may include capacitances between each of ports 421-424 and a central node, to which port 425 is coupled, where the capacitances may provide increased bandwidth. Alternatively, the ports 421-424 may be directly coupled to the central node. Although the branchline coupler 400 is modeled in FIG. 4 using lumped elements, it may be implemented using microstrip lines, integrated passive devices, or discrete components, in various embodiments.

During operation, an input RF signal is provided to one of ports 421 or 422, and the other one of ports 421 or 422 is terminated (e.g., with a 50 ohm termination). More specifically, when configured for conventional Doherty operation, the input RF signal is provided to port 421 and port 422 is terminated. In this configuration, a first percentage of the power of the input RF signal will travel through the branchline coupler 400 to port 423, and a second percentage of the power of the input RF signal will travel through the branchline coupler 400 to port 424, where the first and second percentages total to about 100 percent of the power of the input RF signal. Due to the nature of the branchline coupler 400, the RF signal produced at port 424 will be delayed (e.g., by about 90 degrees) with respect to the RF signal produced at port 423. Conversely, when configured for inverted Doherty operation, the input RF signal is provided to port 422 and port 421 is terminated. In this configuration, first and second percentages of the power of the input RF signal also will travel through the branchline coupler 400 to ports 423 and 424. Due to the nature of the branchline coupler 400, the RF signal produced at port 423 will be delayed (e.g., by about 90 degrees) with respect to the RF signal produced at port 424.

As discussed previously a split ratio defining circuit (e.g., one of circuits 150, 150', 150") may be coupled to the center node through port 425, or port 425 may be shorted (e.g., to ground with about zero inductance). When port 425 is shorted, branchline coupler 400 functions as a 3 dB splitter, which will deliver 3 dB (about 50 percent) of the power of the input RF signal to each of ports 423 and 424. Conversely, when a split ratio defining circuit is coupled to port 425, the split ratio defining circuit may modify the percentages of the input RF signal power that is delivered to ports 423 and 424. For example, the split ratio defining circuit may be configured or set so that the branchline coupler 400 functions as a 4 dB splitter, a 5 dB splitter, or a splitter with another split ratio other than a 50:50 ratio. In other embodiments, the branchline coupler 400 may exclude port 425, and may provide a fixed split ratio (e.g., 50:50 or some other ratio). When an unequal split ratio is desired, the impedances of the opposite arms in the branchline coupler 400 may be varied. Although a particular embodiment of a branchline coupler is illustrated in FIG. 4, it should be understood that branchline couplers having other configurations alternatively may be used, in other embodiments.

Figure 5:
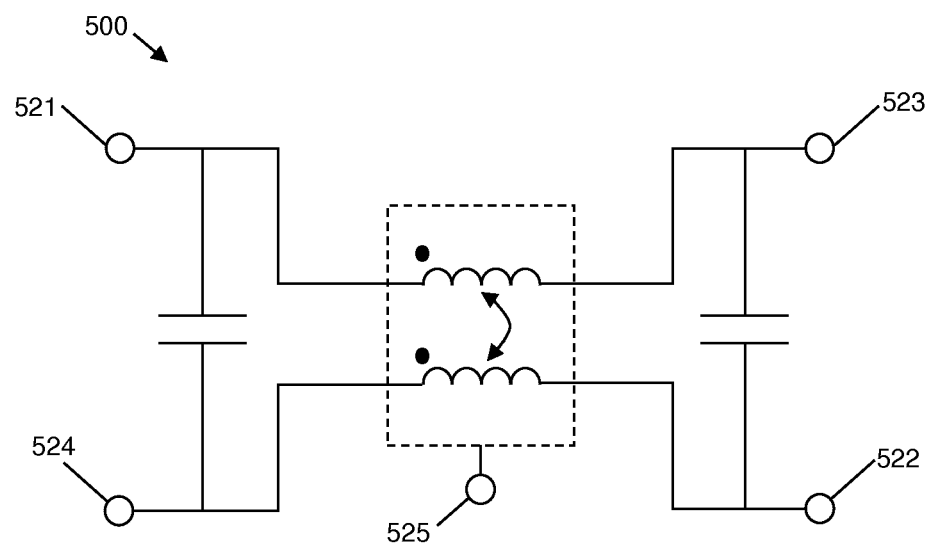
FIG. 5 illustrates a quadrature coupler, in accordance with an example embodiment.

FIG. 5 illustrates a quadrature coupler 500 that may be included in a power divider (e.g., power divider 120, FIG. 1), in accordance with an example embodiment. Once again, although quadrature coupler 500 is modeled in FIG. 5 using lumped elements, it may be implemented using microstrip lines, integrated passive devices, or discrete components, in various embodiments. Quadrature coupler 500 includes five ports 521, 522, 523, 524, 525, in the illustrated embodiment, which correspond to ports 121-125 of FIG. 1. Essentially, quadrature coupler 500 includes a first inductance extending between ports 521 and 523, and a second inductance extending between ports 522 and 524, where the first and second inductance are mutually coupled. In addition, quadrature coupler 500 may include a capacitance between ports 521 and 524, and a capacitance between ports 523 and 522. Although the quadrature coupler 500 is modeled in FIG. 5 using lumped elements, it may be implemented using microstrip lines, integrated passive devices, or discrete components, in various embodiments.

A mutual inductance is present between the first and second inductances, and the coupling factor, K, between the first and second inductances defines the power split ratio of the quadrature coupler 500. During operation, an input RF signal is provided to one of ports 521 or 522, and the other one of ports 521 or 522 is terminated (e.g., with a 50 ohm termination). More specifically, when configured for conventional Doherty operation, the input RF signal is provided to port 521, and port 522 is terminated. In this configuration, a first percentage of the power of the input RF signal will convey through the quadrature coupler 500 to port 523, and a second percentage of the power of the input RF signal will convey (through mutual inductance) through the quadrature coupler 500 to port 524, where the first and second percentages total to about 100 percent of the power of the input RF signal. Due to the nature of the quadrature coupler 500, the RF signal produced at port 524 will be delayed (e.g., by about 90 degrees) with respect to the RF signal produced at port 523. Conversely, when configured for inverted Doherty operation, the input RF signal is provided to port 522 and, port 521 is terminated. In this configuration, first and second percentages of the power of the input RF signal also will convey through the quadrature coupler 500 to ports 523 and 524. Due to the nature of the quadrature coupler 500, the RF signal produced at port 523 will be delayed (e.g., by about 90 degrees) with respect to the RF signal produced at port 524.

According to an embodiment, quadrature coupler 500 also includes control port 525, which is configured to be coupled to a split ratio defining circuit. The split ratio defining circuit provides a signal that may alter the mutual inductance, and thus the coupling factor between the first and second inductances. Depending on the signal provided to port 525, quadrature coupler 500 may function as a 3 dB splitter, a 4 dB splitter, a 5 dB splitter, or a splitter with another split ratio other than a 50:50 ratio. In other embodiments, the quadrature coupler 500 may exclude port 525, and may provide a fixed split ratio (e.g., 50:50 or some other ratio). Although a particular embodiment of a quadrature coupler is illustrated in FIG. 5, it should be understood that quadrature couplers having other configurations alternatively may be used, in other embodiments.

Figure 6:
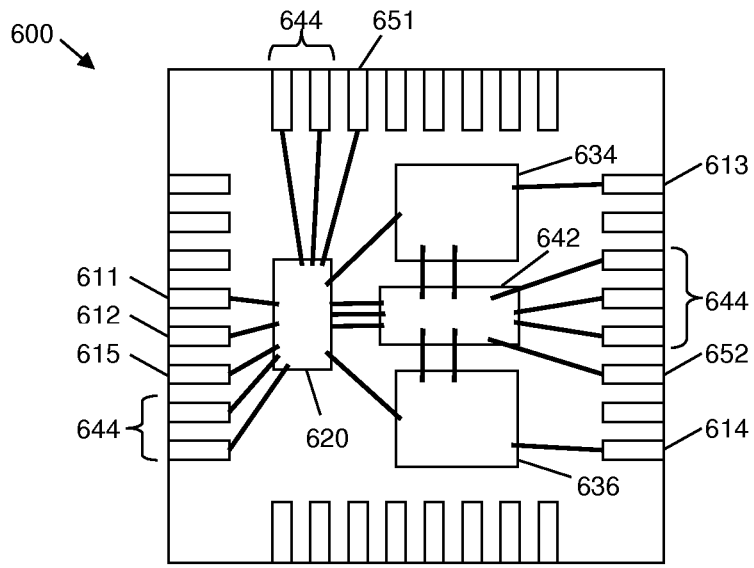
FIG. 6 illustrates a top view of an example of a reconfigurable power splitter device, in accordance with an example embodiment.

As discussed above, a power divider (e.g., power divider 120, FIG. 1) may be implemented in a packaged power splitter device (e.g., power splitter 110, FIG. 1), which may include other signal processing circuitry (e.g., adjustable phase shifters 134, 136, and/or adjustable attenuators 138, 140) and control circuitry (e.g., controller 142 and digital interface 144, FIG. 1). For example, FIG. 6 illustrates a top view of an example of a reconfigurable power splitter device 600 (e.g., power splitter 110, FIG. 1) that may be included in a reconfigurable power amplifier (e.g., reconfigurable Doherty power amplifier 100, FIG. 1), in accordance with an example embodiment.

Power splitter device 600 is implemented as a Quad Flat No-lead (QFN) device in the illustrated embodiment, which includes a plurality of terminals 611-615, 644, 651, 652, and a plurality of integrated circuit chips 620, 634, 636, 642 (ICs) in a plastic package. Prior to encapsulation, the ICs 620, 634, 636, 642 may be physically coupled to a flange (not illustrated) and electrically coupled to the terminals 611-615, 644, 651, 652 through wirebonds (as shown) or through other conductive structures, in various embodiments. Further, the ICs 620, 634, 636, 642 may be electrically coupled to each other through additional wirebonds (as shown) or through other conductive structures. In an alternate embodiment, power splitter device 600 may be housed in another type of encapsulated package, or in an air-cavity package.

The plurality of ICs includes a power divider IC 620, a first signal adjustment circuit IC 634, a second signal adjustment circuit IC 636, and a controller IC 642, in an embodiment. ICs 620, 634, 636, 642 may be, for example, any combination of silicon based ICs (including silicon-on-insulator, silicon-on-sapphire, and so on), gallium-arsenide (GaAs) ICs, gallium nitride (GaN) ICs, indium gallium phosphide (InGaP) ICs, or other types of semiconductor ICs. In some alternate embodiments, some of the functionality of the ICs, and particularly the power divider IC 620, may be implemented using discrete components or stripline conductors. Although a particular number of terminals 611-615, 644, 651, 652 and ICs 620, 634, 636, 642 are depicted in FIG. 6, other embodiments may include more or fewer terminals and/or ICs. For example, in an alternate embodiment, all of the functionality of a reconfigurable power splitter device may be implemented in as few as one IC.

According to an embodiment, power divider IC 620 has five ports, where first, second, and fifth ports (e.g., ports 121, 122, 125, FIG. 1) are coupled to terminals 611, 612, 615. As previously discussed, and as will be demonstrated further in conjunction with FIG. 7, one of the first or second terminals 611, 612 (e.g., terminals 111, 112, FIG. 1) may be coupled to an input RF signal, and the other one of the first or second terminals 611, 612 is terminated (e.g., with a 50 ohm load). Further, the fifth terminal 615 may either be shorted, or may be coupled to a split ratio defining circuit (e.g., one of circuits 150, 150', 150", or another circuit). Further, third and fourth ports of the power divider IC 620 may be coupled to the first and second signal adjustment circuit ICs 634, 636 (e.g., through wirebonds, as illustrated). As previously described, the power divider IC 620 is configured to divide the power of the input RF signal into main and peaking RF signals, which are provided through the third and fourth ports to the first and second signal adjustment circuit ICs 634, 636. The power divider IC 620 may include a branchline coupler (e.g., FIG. 4), a quadrature coupler (e.g., FIG. 5), a Lange coupler, a rat-race coupler, a Gysel power splitter, or another type of suitable power divider, in various embodiments. Further, the power split ratio applied by the power divider IC 620 may be controlled by the signal or voltage received at the fifth port through terminal 615.

As also previously discussed, each of the first and second signal adjustment circuit ICs 634, 636 may be configured to apply a phase shift and/or an attenuation to the main and peaking RF signals received from the power divider IC 620. For example, each of the first and second signal adjustment circuit ICs 634, 636 may include a variable phase shifter (e.g., phase shifter 134, 136, FIG. 1) and/or a variable attenuator (e.g., attenuator 138, 140, FIG. 1). The phase shift and/or attenuation applied by the first and second signal adjustment circuit ICs 634, 636 may be controlled by signals received from the controller IC 642 (e.g., switch control signals). The controller IC 642 may, in turn, receive digital signals through terminals 644 (e.g., serial data), which indicate the phase shifts and attenuations to be applied by each of the first and second signal adjustment circuit ICs 634, 636. After adjustment of the main and peaking RF signals, the first and second signal adjustment circuit ICs 634, 636 produce the adjusted main and peaking RF signals at terminals 613 and 614 (e.g., terminals 113, 114, FIG. 1), respectively.

The ICs 620, 634, 636, 642 may receive power (e.g., Vdd) and a ground reference through two or more of the terminals (e.g., terminals 651, 652). Further, in embodiments that include a controller IC (e.g., controller IC 642), a plurality of other terminals 644 collectively may provide a digital interface (e.g., digital interface 144, FIG. 1). For example, the digital interface may include terminals corresponding to serial data in (SDI), serial data out (SDO), one or more clock signals, and so on. In such an embodiment, signals destined for or produced by the controller IC 642 may be communicated through the digital interface terminals 644 to circuitry external to the device 600 (e.g., to microcontroller 180, FIG. 1). The digital interface terminals 644 may be directly connected with wirebonds to the controller IC 642, and/or the digital interface terminals 644 may be connected with wirebonds to other ICs (e.g., to power divider IC 620), which may communicate the signals to the controller IC 642 through additional wirebonds.

Power splitter device 600 is "reconfigurable" in that the phase difference and power levels of the main and peaking RF signals produced at terminals 613 and 614 depend on which terminal (i.e., terminal 611 or 612) receives the input RF signal, and the type of circuitry (if any) coupled to terminal 615. In any event, to form a complete Doherty amplifier, an embodiment of a reconfigurable power splitter device may be coupled to a PCB that includes other portions of the Doherty power amplifier. Since the signals supplied to the power splitter device may result in either a conventional or an inverted Doherty power amplifier, the reconfigurable power splitter device renders the Doherty power amplifier a "reconfigurable" Doherty power amplifier.

Figure 7:
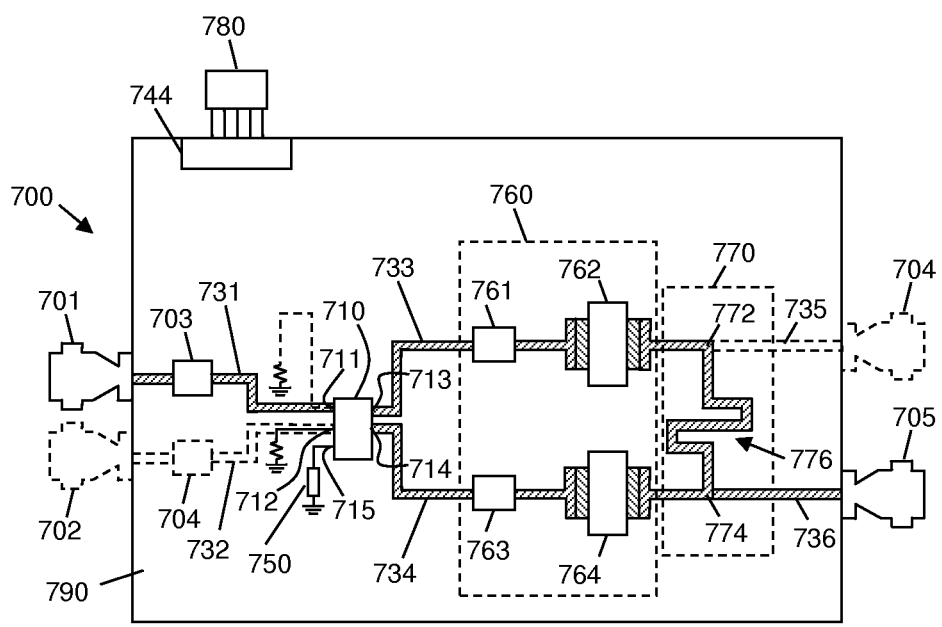
FIG. 7 illustrates a top view of an example of a physical implementation of a reconfigurable Doherty power amplifier, in accordance with an example embodiment.

FIG. 7 is a top view of a simplified depiction of a physical implementation of a reconfigurable Doherty power amplifier 700, in accordance with an example embodiment. The components of the Doherty power amplifier 700 are shown both in a conventional Doherty power amplifier configuration, and with alternate components illustrated using dashed lines, also in an inverted Doherty power amplifier configuration.

Doherty power amplifier 700 includes a plurality of elements (e.g., conductive traces, devices, connectors, and so on) on a single-layer or multi-layer PCB 790, in an embodiment. In the conventional Doherty amplifier configuration, the Doherty power amplifier includes an input connector 701 (e.g., terminal 101, FIG. 1), which is configured to receive an input RF signal from an RF signal source (e.g., RF IN 202, FIG. 2), and which is electrically coupled through a first conductive path 731 to an embodiment of a reconfigurable power splitter 710 (e.g., power splitter 110 or 600, FIGS. 1, 6). The first conductive path 731 may include, for example, a general purpose pre-amplifier 703 (GPA), a conductive trace between the input connector 701 and the GPA 703, and a conductive trace between the GPA 703 and input terminal 711 of the power splitter 710 (e.g., terminal 111 or 611, FIGS. 1, 6). The GPA 703 may be excluded, in an alternate embodiment, and/or other components may be present in the first conductive path 731. A second input terminal 712 of the power splitter 710 (e.g., terminal 112 or 612, FIGS. 1, 6) may be terminated (e.g., with a 50 ohm termination). Further, a third terminal 715 of the power splitter 710 (e.g., terminal 115 or 615, FIGS. 1, 6) may be coupled to a split ratio defining circuit 750 (e.g., split ratio defining circuit 150, 150', 150", FIG. 1), or the third terminal 715 may be shorted to ground. In an alternate embodiment, the third terminal 715 may be excluded altogether. In still other alternate embodiments, the split ratio defining circuit 750 may be internal to the power splitter 710.

In the inverted Doherty amplifier configuration, the input connector 701 and the first conductive path 731 may be excluded. Instead, the Doherty power amplifier includes an alternate input connector 702 (e.g., terminal 102, FIG. 1) for receiving the input RF signal, which is electrically coupled through an alternate conductive path 732 (shown with dashed lines) to an embodiment of the reconfigurable power splitter 710 (e.g., power splitter 110 or 600, FIGS. 1, 6). The alternate conductive path 732 may include, for example, a GPA 704, and alternate conductive traces between the input connector 702 and the GPA 704, and between the GPA 704 and input terminal 712 of the power splitter 710 (e.g., terminal 112 or 612, FIGS. 1, 6). The GPA 704 may be excluded, in an alternate embodiment. Input terminal 711 of the power splitter 710 (e.g., terminal 111 or 611, FIGS. 1, 6) may be terminated (e.g., with a 50 ohm termination, shown with dashed lines). Once again, the third terminal 715 (e.g., terminal 115 or 615, FIGS. 1, 6) may be coupled to a split ratio defining circuit 750, shorted to ground, or excluded altogether.

As described in detail above, the reconfigurable power splitter 710 is configured to divide the power of the input RF signal received at either terminal 711 or 712 into a main RF signal and a peaking RF signal using a power divider (e.g., power divider 120, 400, 500, 620, FIGS. 1-6). The reconfigurable power splitter 710 also may include one or more signal adjustment circuits (e.g., including phase shifters 134, 136 and/or attenuators 138, 140, FIG. 1), which may further process the main and/or peaking RF signals. The phase shifts and/or attenuations provided by the signal adjustment circuits may be digitally controlled through signals received from a microcontroller 780 (e.g., microcontroller 180, FIG. 1). According to an embodiment, the microcontroller 780 may provide the signals through a connector 744 that is coupled to the PCB 790, along with a plurality of conductive traces (not shown) between the connector 744 and the reconfigurable power splitter 710. In some embodiments, the microcontroller 780 or other sources also may provide signals through the connector 744 that affect the signal adjustment circuit 750, such as when the signal adjustment circuit 750 includes components that may be digitally controlled, or controlled through analog signals.

The main RF signal is provided at terminal 713 to conductive path 733, and the peaking RF signal is provided at terminal 714 to conductive path 734. In the conventional Doherty configuration, the peaking RF signal at terminal 714 may lag the main RF signal at terminal 713 by a phase delay of about 90 degrees. Conversely, in the inverted Doherty configuration, the main RF signal at terminal 713 may lag the peaking RF signal at terminal 714 by about 90 degrees.

Essentially, conductive paths 733 and 734 couple the reconfigurable power splitter 710 to amplifier circuit 760 (e.g., amplifier circuit 160, FIG. 1). In the illustrated embodiment, the main amplifier is a multi-stage amplifier, which includes a driver amplifier 761 and a final stage main amplifier 762, both of which are implemented as separately packaged power transistors. Similarly, the peaking amplifier includes a driver amplifier 763 and a final stage peaking amplifier 764. In alternate embodiments, each set of driver and peaking amplifiers may be included in a single packaged device, or each of the main and peaking amplifiers may be single-stage amplifiers.

The final stage main and peaking amplifiers 762, 764 amplify their respective input RF signals, and provide amplified main and peaking RF signals to power combiner circuit 770 (e.g., power combiner circuit 170, FIG. 1). The power combiner circuit 770 includes nodes 772, 774 (e.g., nodes 172, 174, FIG. 1), and a phase delay element 776 (e.g., phase delay element 176, FIG. 1) coupled between the nodes 772, 774. For example, the phase delay element 776 may be a quarter wave transmission line, which is configured to impart about a 90 degree phase delay to an RF signal that travels through the element 776.

In the conventional Doherty power amplifier configuration, node 774 functions as the combiner node, and the main and peaking RF signals produced by amplifiers 762 and 764 are summed in-phase at node 774. Node 774 is coupled through conductive path 736 to an output connector 705 (e.g., terminal 105, FIG. 1), which is configured to produce the combined RF signal from node 774. The output connector 705 may in turn be coupled to a load (e.g., an antenna, not illustrated).

Conversely, in the inverted Doherty power amplifier configuration, conductive path 736 and connector 705 may be excluded. Instead, node 772 functions as the combiner node, and the main and peaking RF signals produced by amplifiers 762 and 764 are summed in-phase at node 772. Node 772 is coupled through alternate conductive path 735 to an alternate output connector 704 (e.g., terminal 104, FIG. 1) (shown with dashed lines). In the inverted Doherty power amplifier configuration, the output connector 704 is configured to produce the combined RF signal from node 772. Once again, the output connector 704 may be coupled to a load.

Although not shown in FIG. 7, Doherty power amplifier 700 may include additional circuitry, as well. For example, Doherty power amplifier 700 may include various impedance matching circuits, transistor biasing circuits, feedback circuits, and so on. Further, the physical layout of the Doherty power amplifier 700 and/or the locations of the various terminals may be different from that shown. Various other modifications may be made to Doherty power amplifier 700 while still embodying the inventive reconfigurability of the Doherty power amplifier 700.

Figure 8:
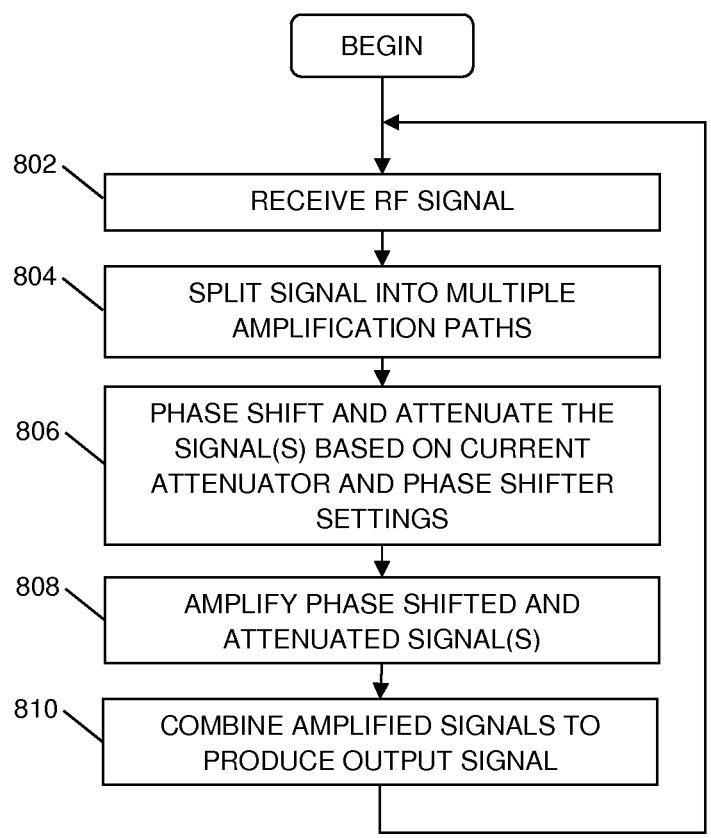
FIG. 8 illustrates a flowchart of a method for amplifying a signal using a system that includes a reconfigurable power splitter, in accordance with an example embodiment.

FIG. 8 illustrates a flowchart of a method for amplifying a signal using a reconfigurable Doherty power amplifier system (e.g., system 100, 700, FIGS. 1, 7) that includes an embodiment of a reconfigurable power splitter (e.g., reconfigurable power splitter 110, 600, 710, FIGS. 1, 6, 7), in accordance with an example embodiment. For example, portions of the method may be performed by the reconfigurable power splitter, while other portions of the method may be performed by downstream components of the amplifier system (e.g., by amplifiers 162, 164, 761-764 and combiner 170, 770, FIGS. 1, 7).

In block 802, the system receives an input RF signal (e.g., at one of terminals 101 or 102 or one of connectors 701 or 702, FIGS. 1, 7). In block 804, the power of the received signal may be divided (e.g., by a power divider 120, 400, 500, 620, FIGS. 1-6 within reconfigurable power splitter 110, 600, 710, FIGS. 1, 6, 7) into two or more signals, each of which will be further processed along a distinct amplification path (e.g., paths 106, 108). In block 806, each signal may be phase shifted and attenuated (e.g., by phase shifters 134, 136 and attenuators 138, 140) within the reconfigurable power splitter based on current settings of the phase shifters and attenuators along the respective paths (i.e., the settings established by a microcontroller 180, 780, FIGS. 1, 7).

In block 808, the phase shifted and attenuated signals are amplified (e.g., by amplifiers 162, 164, 761-764, FIGS. 1, 7). The amplified signals may then be combined, in block 810, by a combiner circuit (e.g., combiner 170, 770, FIGS. 1, 7) to produce an amplified output RF signal (e.g., at one of terminals 104 or 105 or at one of connectors 704 or 705, FIGS. 1, 7). According to an embodiment, the combiner circuit also may apply a phase shift to one or more of the signals to ensure that the signals are summed in phase before being provided to the output terminal.

An embodiment of a Doherty amplifier includes an RF signal input terminal configured to receive an input RF signal, a packaged power splitter device, main and peaking amplification paths, a combiner circuit, and an RF signal output terminal. The packaged power splitter device includes a power divider, a first input terminal coupled to a first port of the power divider, a second input terminal coupled to a second port of the power divider, a first output terminal coupled to a third port of the power divider, and a second output terminal coupled to a fourth port of the power divider. The first input terminal is coupled to the RF signal input terminal, the second input terminal is terminated, and the power divider is configured to receive the input RF signal and to produce a main RF signal at the third port of the power divider and a peaking RF signal at the fourth port of the power divider. The main amplification path is coupled to the first output terminal of the power splitter device, and the main amplification path includes a main amplifier configured to amplify the main RF signal. The peaking amplification path is coupled to the second output terminal of the power splitter device, and the peaking amplification path includes a peaking amplifier configured to amplify the peaking RF signal. The combiner circuit includes a summing node and a phase delay element between an output of the main amplifier and an output of the peaking amplifier. The RF signal output terminal is coupled to the summing node.

An embodiment of a packaged power splitter device includes first, second, third, and fourth device terminals, and a power divider. The first device terminal is configured to be coupled to a termination or to an RF signal source that produces an input RF signal that has a first RF signal power. The second device terminal is configured to be coupled to the RF signal source when the first device terminal is coupled to the termination, or to the termination when the first device terminal is coupled to the RF signal source. The third device terminal is configured to be coupled to a first amplifier path, and the fourth device terminal is configured to be coupled to a second amplifier path. The power divider has a first divider port coupled to the first device terminal, a second divider port coupled to the second device terminal, a third divider port coupled to the third device terminal, a fourth divider port coupled to the fourth device terminal, and a fifth divider port that is configured to be coupled to a split ratio adjustment circuit. Each of the first and second divider ports is configured to receive the input RF signal. The power divider is configured to divide the first RF signal power of the input RF signal into first and second output RF signals, where the first output RF signal has a second RF signal power that is dependent on the split ratio adjustment circuit, and the second output RF signal has a third RF signal power that is dependent on the split ratio adjustment circuit. The third divider port is configured to produce the first output RF signal, and the fourth divider port is configured to produce the second output RF signal.

According to a further embodiment, the power divider is selected from a branchline coupler, a quadrature coupler, a Lange coupler, a rat-race coupler, a Gysel power splitter, a single-section coupler, and a cascaded coupler. According to another further embodiment, the device further includes the split ratio adjustment circuit, and the split ratio adjustment circuit may be selected from a passive load, an active load, a variable capacitor, a varactor diode, and an RLC circuit. According to yet another further embodiment, the split ratio adjustment circuit is external to the power splitter device, and the power splitter device further includes a fifth device terminal coupled to the fifth divider port, and configured to be coupled to the split ratio adjustment circuit. According to yet another further embodiment, the power splitter device further includes one or more signal adjustment circuits coupled between the third and fourth divider ports and the third and fourth device terminals, where the one or more signal adjustment circuits are configured to alter one or more signal characteristics of either or both of the first output RF signal and the second output RF signal.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier comprising:
   a radio frequency (RF) signal input terminal configured to receive an input RF signal;
   a packaged power splitter device with a power divider, a first input terminal, a second input terminal, a first output terminal, and a second output terminal, wherein the power divider includes a first port coupled to the first input terminal, a second port coupled to the second input terminal, a third port coupled to the first output terminal, a fourth port coupled to the second output terminal, and a fifth port that is configured to be coupled to a split ratio adjustment circuit, and wherein the first input terminal is coupled to the RF signal input terminal, the second input terminal is terminated, and the power divider is configured to receive the input RF signal and to produce a main RF signal at the third port of the power divider and a peaking RF signal at the fourth port of the power divider;
   a main amplification path coupled to the first output terminal of the power splitter device, wherein the main amplification path includes a main amplifier configured to amplify the main RF signal;
   a peaking amplification path coupled to the second output terminal of the power splitter device, wherein the peaking amplification path includes a peaking amplifier configured to amplify the peaking RF signal;
   a combiner circuit that includes a summing node and a phase delay element between an output of the main amplifier and an output of the peaking amplifier; and
   an RF signal output terminal coupled to the summing node.

2. The Doherty amplifier of claim 1, wherein:
   the power divider is configured to impart a phase delay to the peaking RF signal with respect to the main RF signal,
   the summing node is directly coupled to the output of the peaking amplifier, and
   the summing node is coupled through the phase delay element to the output of the main amplifier.

3. The Doherty amplifier of claim 1, wherein:
the power divider is configured to impart a phase delay to the main RF signal with respect to the peaking RF signal,
the summing node is directly coupled to the output of the main amplifier, and
the summing node is coupled through the phase delay element to the output of the peaking amplifier.

4. The Doherty amplifier of claim 1, wherein the power divider is selected from a branchline coupler, a quadrature coupler, a Lange coupler, a rat-race coupler, a Gysel power splitter, a single-section coupler, and a cascaded coupler.

5. A Doherty amplifier comprising:
a radio frequency (RF) signal input terminal configured to receive an input RF signal;
a split ratio adjustment circuit;
a packaged power splitter device with a power divider, a first input terminal coupled to a first port of the power divider, a second input terminal coupled to a second port of the power divider, a first output terminal coupled to a third port of the power divider, and a second output terminal coupled to a fourth port of the power divider, wherein the first input terminal is coupled to the RF signal input terminal, the second input terminal is terminated, and the power divider is configured to receive the input RF signal and to produce a main RF signal at the third port of the power divider and a peaking RF signal at the fourth port of the power divider, and wherein the power divider further includes a fifth port coupled to the split ratio adjustment circuit, wherein the main RF signal has a first RF signal power that is dependent on the split ratio adjustment circuit, and the peaking RF signal has a second RF signal power that is dependent on the split ratio adjustment circuit;
a main amplification path coupled to the first output terminal of the power splitter device, wherein the main amplification path includes a main amplifier configured to amplify the main RF signal;
a peaking amplification path coupled to the second output terminal of the power splitter device, wherein the peaking amplification path includes a peaking amplifier configured to amplify the peaking RF signal;
a combiner circuit that includes a summing node and a phase delay element between an output of the main amplifier and an output of the peaking amplifier; and
an RF signal output terminal coupled to the summing node.

6. The Doherty amplifier of claim 5, wherein the split ratio adjustment circuit is selected from a passive load, an active load, a variable capacitor, a varactor diode, and an RLC circuit.

7. The Doherty amplifier of claim 5, wherein the split ratio adjustment circuit is external to the packaged power splitter device, and the packaged power splitter device further comprises:
a fifth terminal coupled to the fifth divider port and configured to be coupled to the split ratio adjustment circuit.

8. The Doherty amplifier of claim 5, wherein the power divider is a branchline coupler that includes a central node coupled to the fifth port, and wherein the first RF signal power and the second RF signal power may be altered when the split ratio defining circuit is coupled to the fifth port and the central node.

9. The Doherty amplifier of claim 5, wherein the power divider is a quadrature coupler that includes first and second inductances, wherein a mutual inductance is present between the first and second inductances, the fifth port is a control port, and the mutual inductance may be altered when the split ratio defining circuit is coupled to the fifth port.

10. A Doherty amplifier comprising:
a radio frequency (RF) signal input terminal configured to receive an input RF signal;
a packaged power splitter device with
a power divider,
a first input terminal coupled to a first port of the power divider, wherein the first input terminal is coupled to the RF signal input terminal,
a second input terminal coupled to a second port of the power divider, wherein the second input terminal is terminated,
a first output terminal coupled to a third port of the power divider,
a second output terminal coupled to a fourth port of the power divider, and
one or more signal adjustment circuits coupled between the third and fourth ports of the power divider and the first and second output terminals of the power splitter device,
wherein the power divider is configured to receive the input RF signal and to produce a main RF signal at the third port of the power divider and a peaking RF signal at the fourth port of the power divider, and wherein the one or more signal adjustment circuits are configured to alter one or more signal characteristics of either or both of the main RF signal and the peaking RF signal, and wherein the one or more signal characteristics include a phase shift and an attenuation, and wherein the one or more signal adjustment circuits include one or more phase shifters and one or more attenuators;
a main amplification path coupled to the first output terminal of the power splitter device, wherein the main amplification path includes a main amplifier configured to amplify the main RF signal;
a peaking amplification path coupled to the second output terminal of the power splitter device, wherein the peaking amplification path includes a peaking amplifier configured to amplify the peaking RF signal;
a combiner circuit that includes a summing node and a phase delay element between an output of the main amplifier and an output of the peaking amplifier; and
an RF signal output terminal coupled to the summing node.

11. A packaged power splitter device comprising:
a first device terminal configured to be coupled to a termination or to a radio frequency (RF) signal source that produces an input RF signal that has a first RF signal power;
a second device terminal configured to be coupled to the RF signal source when the first device terminal is coupled to the termination, or to the termination when the first device terminal is coupled to the RF signal source;
a third device terminal configured to be coupled to a first amplifier path;
a fourth device terminal configured to be coupled to a second amplifier path; and
a power divider with a first divider port coupled to the first device terminal, a second divider port coupled to the second device terminal, a third divider port coupled to the third device terminal, a fourth divider port coupled to the fourth device terminal, and a fifth divider port that is configured to be coupled to a split ratio adjustment circuit, wherein each of the first and second divider ports is configured to receive the input RF signal, the power divider is configured to divide the first RF signal power of the input RF signal into first and second output RF signals, wherein the first output RF signal has a second RF signal power that is dependent on the split ratio adjustment circuit, the second output RF signal has a third RF signal power that is dependent on the split ratio adjustment circuit, the third divider port is configured to produce the first output RF signal, and the fourth divider port is configured to produce the second output RF signal.

12. The power splitter device of claim 11, wherein the power divider is selected from a branchline coupler, a quadrature coupler, a Lange coupler, a rat-race coupler, a Gysel power splitter, a single-section coupler, and a cascaded coupler.

13. The power splitter device of claim 12, wherein the power divider is a branchline coupler that includes a central node coupled to the fifth divider port, and wherein the second RF signal power and the third RF signal power may be altered when the split ratio defining circuit is coupled to the fifth divider port and the central node.

14. The power splitter device of claim 12, wherein the power divider is a quadrature coupler that includes first and second inductances, wherein a mutual inductance is present between the first and second inductances, the fifth divider port is a control port, and the mutual inductance may be altered when the split ratio defining circuit is coupled to the fifth divider port.

15. The power splitter device of claim 11, further comprising:
the split ratio adjustment circuit, wherein the split ratio adjustment circuit is selected from a passive load, an active load, a variable capacitor, a varactor diode, and an RLC circuit.

16. The power splitter device of claim 11, wherein the split ratio adjustment circuit is external to the power splitter device, and the power splitter device further comprises:
a fifth device terminal coupled to the fifth divider port, and configured to be coupled to the split ratio adjustment circuit.

17. The power splitter device of claim 11, further comprising:
one or more signal adjustment circuits coupled between the third and fourth divider ports and the third and fourth device terminals, wherein the one or more signal adjustment circuits are configured to alter one or more signal characteristics of either or both of the first output RF signal and the second output RF signal.

18. The power splitter device of claim 17, wherein the one or more signal characteristics include a phase shift and an attenuation, and wherein the one or more signal adjustment circuits include one or more phase shifters and one or more attenuators.

19. The power splitter device of claim 18, wherein the one or more phase shifters and the one or more attenuators are digitally controlled and have a plurality of states.

20. The power splitter device of claim 11, wherein the power divider and the first, second, third, and fourth device terminals are housed in a package selected from an air cavity package and an encapsulated package.

* * * * *